(12) United States Patent
Dash

(10) Patent No.: US 10,387,594 B1
(45) Date of Patent: Aug. 20, 2019

(54) INCREASING AVAILABLE FLIP-FLOP COUNT FOR PLACEMENT OF A CIRCUIT DESIGN IN PROGRAMMABLE LOGIC AND CIRCUITRY THEREFOR

(71) Applicant: Xilinx, Inc., San Jose, CA (US)

(72) Inventor: Chinmaya Dash, Hyderabad (IN)

(73) Assignee: XILINX, INC., San Jose, CA (US)

( * ) Notice: Subject to any disclaimer, the term of this patent is extended or adjusted under 35 U.S.C. 154(b) by 75 days.

(21) Appl. No.: 15/707,897

(22) Filed: Sep. 18, 2017

(51) Int. Cl.
*G06F 17/50* (2006.01)
*H03K 19/01* (2006.01)
*H03K 19/17* (2006.01)
*H03K 19/0175* (2006.01)
*H03K 19/177* (2006.01)

(52) U.S. Cl.
CPC ...... *G06F 17/5027* (2013.01); *G06F 17/5054* (2013.01); *G06F 17/5072* (2013.01); *H03K 19/017581* (2013.01); *H03K 19/17708* (2013.01)

(58) Field of Classification Search
CPC ............. G06F 17/5054; G06F 17/5072; G06F 17/5027; H03K 19/017581; H03K 19/17708
USPC ......................................... 716/100, 110, 116
See application file for complete search history.

(56) References Cited

U.S. PATENT DOCUMENTS 9,531,351 B1   12/2016  Devlin et al.
9,537,491 B1    1/2017  Ganusov et al.
9,836,568 B1 *  12/2017  Ganusov et al. ... G06F 17/5081

* cited by examiner

*Primary Examiner* — Sun J Lin
(74) *Attorney, Agent, or Firm* — W. Eric Webostad; John J. King

(57) ABSTRACT

An integrated circuit having programmable logic fabric, as well as system and method for computer aided design using such integrated circuit, are disclosed. This integrated circuit includes: a configurable bypassable flip-flop circuit configured to transfer information from programmable internal routing to an input bus of a programmable logic circuit; a loopback branch connected to the input bus to bypass the programmable logic circuit; and a multiplexer having a first input port connected to the loopback branch, a second input port connected to an output bus of the programmable logic circuit, and an output port connected to routing switches of the programmable internal routing. The multiplexer is configured to electrically couple either the first input port or the second input port to the output port.

20 Claims, 11 Drawing Sheets

US 10,387,594 B1

INCREASING AVAILABLE FLIP-FLOP COUNT FOR PLACEMENT OF A CIRCUIT DESIGN IN PROGRAMMABLE LOGIC AND CIRCUITRY THEREFOR

TECHNICAL FIELD

The following description relates generally to integrated circuits. More particularly, the following description relates to increasing available flop-flop count for placement of a circuit design in programmable logic and circuitry therefor.

BACKGROUND

Current programmable logic integrated circuit architectures have input flip-flops to circuit blocks. However, these input flip-flops have not been available for placement if such circuit blocks are not part of a placed circuit design, such as for instantiation in programmable logic fabric, such as of a programmable logic device for example.

SUMMARY

An integrated circuit relates generally to programmable logic fabric. In such an integrated circuit, a configurable bypassable flip-flop circuit is configured to transfer information from programmable internal routing to an input bus of a programmable logic circuit. A loopback branch is connected to the input bus to bypass the programmable logic circuit. A multiplexer has a first input port connected to the loopback branch, a second input port connected to an output bus of the programmable logic circuit, and an output port connected to routing switches of the programmable internal routing. The multiplexer is configured to electrically couple the first input port or the second input port to the output port.

A method relates generally to computer aided circuit design. In such a method, a logic design is synthesized to generate a netlist. Components identified in the netlist are placed to map to circuits of an integrated circuit. The placing of the components includes: generating an initial placement of the components; analyzing the initial placement to provide a pipeline analysis; identifying a site for insertion of a configurable bypassable flip-flop circuit into the initial placement responsive to the pipeline analysis for an unplaced circuit of the integrated circuit with respect to the components placed in the initial placement; and inserting the configurable bypassable flip-flop circuit into the site to provide a revised placement.

A method relates generally to pipeline site identification in an integrated circuit. In such a method, obtained is a placed circuit design with respect to the integrated circuit. Unused programmable logic circuits of the integrated circuit are found with respect to the placed circuit design. Flip-flop circuits corresponding to the unused programmable logic circuits are marked as valid pipeline sites. One or more of the flip-flop circuits are inserted into the placed circuit design.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 2-1 is a block diagram depicting an exemplary set programmably configurable elements ("CoE").

FIG. 2-2 is a block diagram depicting an exemplary Field Programmable Gate Array ("FPGA").

DETAILED DESCRIPTION

Figure 1:
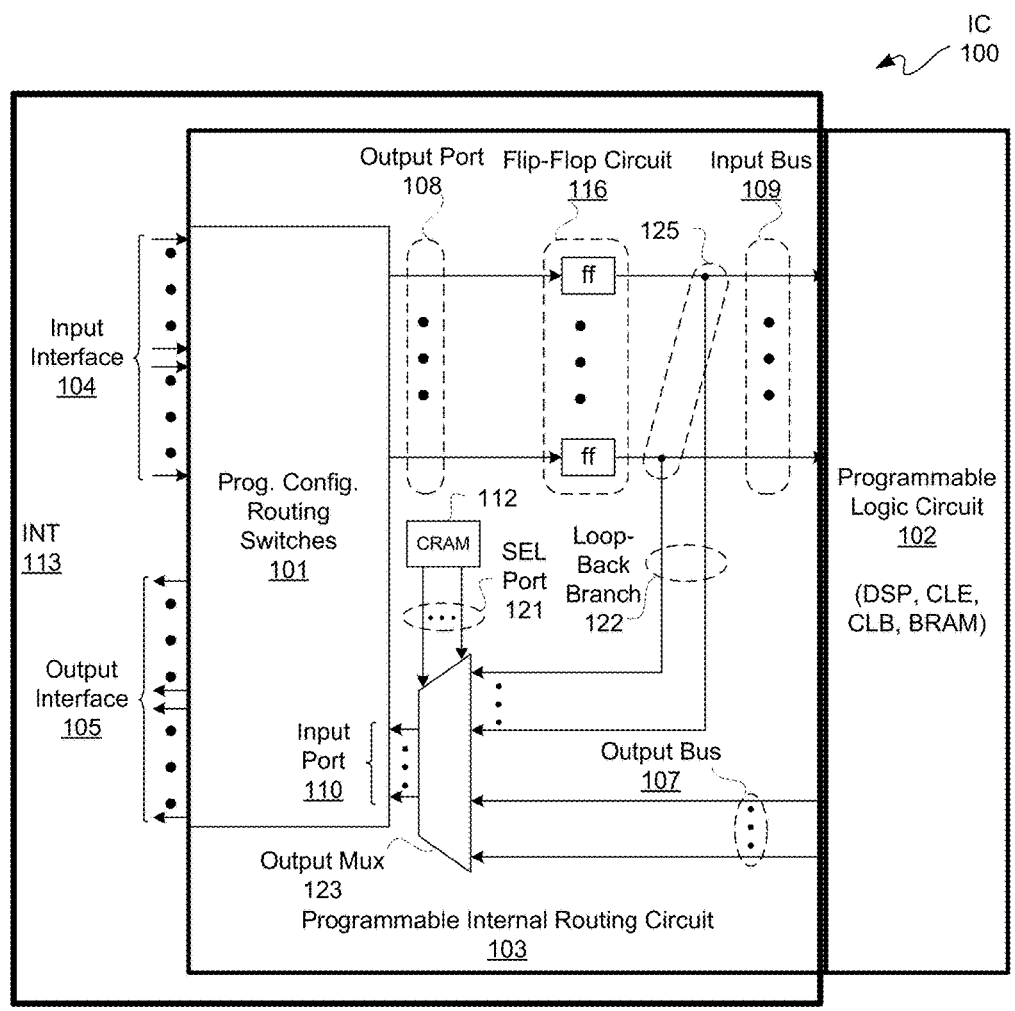
FIG. 1 is a block diagram depicting an exemplary integrated circuit device ("IC").

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Reference will now be made in detail to examples which are illustrated in the accompanying drawings. In the following detailed description, numerous specific details are set forth in order to provide a thorough understanding of the following described implementation examples. It should be apparent, however, to one skilled in the art, that the implementation examples described below may be practiced without all the specific details given below. Moreover, the example implementations are not intended to be exhaustive or to limit scope of this disclosure to the precise forms disclosed, and modifications and variations are possible in light of the following teachings or may be acquired from practicing one or more of the teachings hereof. The implementation examples were chosen and described in order to best explain principles and practical applications of the teachings hereof to enable others skilled in the art to utilize one or more of such teachings in various implementation examples and with various modifications as are suited to the particular use contemplated. In other instances, well-known methods, procedures, components, circuits, and/or networks have not been described in detail so as not to unnecessarily obscure the described implementation examples.

For purposes of explanation, specific nomenclature is set forth to provide a thorough understanding of the various concepts disclosed herein. However, the terminology used herein is for the purpose of describing particular examples only and is not intended to be limiting. As used herein, the singular forms "a", "an" and "the" are intended to include the plural forms as well, unless the context clearly indicates otherwise. As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. It will also be understood that the term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

Some portions of the detailed descriptions that follow are presented in terms of algorithms and symbolic representations of operations on data bits, including within a register or a memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those involving physical manipulations of physical quantities. Usually, though not necessarily, these quantities take the form of optical, electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers or memories into other data similarly represented as physical quantities within the computer system memories or registers or other such information storage, transmission or display devices.

Concepts described herein may be embodied as apparatus, method, system, or computer program product. Accordingly, one or more of such implementation examples may take the form of an entirely hardware implementation example, an entirely software implementation example (including firmware, resident software, and micro-code, among others) or an implementation example combining software and hardware, and for clarity any and all of these implementation examples may generally be referred to herein as a "circuit," "module," "system," or other suitable terms. Furthermore, such implementation examples may be of the form of a computer program product on a computer-usable storage medium having computer-usable program code in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory ("RAM"), a read-only memory ("ROM"), an erasable programmable read-only memory ("EPROM" or Flash memory), an optical fiber, a portable compact disc read-only memory ("CD-ROM"), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, radio frequency ("RF") or other means. For purposes of clarity by way of example and not limitation, the latter types of media are generally referred to as transitory signal bearing media, and the former types of media are generally referred to as non-transitory signal bearing media.

Computer program code for carrying out operations in accordance with concepts described herein may be written in an object oriented programming language such as Java, Smalltalk, C++ or the like. However, the computer program code for carrying out such operations may be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network ("LAN") or a wide area network ("WAN"), or the connection may be made to an external computer (for example, through the Internet using an Internet Service Provider).

Systems and methods described herein may relate to an apparatus for performing the operations associated therewith. This apparatus may be specially constructed for the purposes identified, or it may include a general-purpose computer selectively activated or reconfigured by a computer program stored in the computer.

Notwithstanding, the algorithms and displays presented herein are not inherently related to any particular computer or other apparatus. Various general-purpose systems may be used with programs in accordance with the teachings herein, or it may prove convenient to construct a more specialized apparatus to perform the operations. In addition, even if the following description is with reference to a programming language, it should be appreciated that any of a variety of programming languages may be used to implement the teachings as described herein.

One or more examples are described below with reference to flowchart illustrations and/or block diagrams of methods, apparatus (including systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the Figures illustrate the architecture, functionality, and operation of possible implementations of apparatuses (including systems), methods and computer program products according to various implementation examples. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

It should be understood that although the flow charts provided herein show a specific order of operations, it is understood that the order of these operations may differ from what is depicted. Also two or more operations may be performed concurrently or with partial concurrence. Such variation will depend on the software and hardware systems chosen and on designer choice. It is understood that all such variations are within the scope of the disclosure. Likewise, software and web implementations may be accomplished with standard programming techniques with rule based logic and other logic to accomplish the various database searching operations, correlation operations, comparison operations and decision operations. It should also be understood that the word "component" as used herein is intended to encompass implementations using one or more lines of software code, and/or hardware implementations, and/or equipment for receiving manual inputs.

Before describing the examples illustratively depicted in the several figures, a general introduction is provided to further understanding.

Current programmable logic fabric architectures have flip-flops at inputs to programmably configurable circuit blocks. Generally, these flip-flop are for pipelining incoming signals. However, unless programmably configurable circuit blocks associated with such input flip-flops are placed as part of a circuit design, such unplaced input flip-flops and associated programmably configurable circuit blocks are not available to placement tools. Moreover, test structures including loopback multiplexers are intended to only be used during factory testing and then made unavailable with respect to instantiation of a circuit design.

As described below in additional detail, input flip-flop circuits are coupled to loopback multiplexers with a loopback branch to allow such input flip-flop circuits to be placed even though programmable logic circuits associated with such input flip-flop circuits are unplaced with respect to a circuit design. This increases the effective available flip-flop count for placing a design in programmable logic fabric architectures, including in programmable logic fabric of a Programmable Logic Device or another IC.

With the above general understanding borne in mind, various configurations for both an IC and a computer aided design ("CAD") program are generally described below.

FIG. 1 is a block diagram depicting an exemplary integrated circuit device ("IC") 100. IC 100 may be any integrated circuit having programmable logic fabric. For example, Programmable Logic Devices ("PLDs") include programmable logic fabric; however, a System-on-Chip or other IC may include programmable logic fabric. Programmable logic fabric may include one or more programmable interconnect circuits, such as for example programmable interconnect circuit ("INT") 113, and programmable logic blocks, such as programmable logic circuit 102. Examples of programmable logic circuits 102 include digital signal processing circuits ("DSPs"), configurable logic element circuits ("CLEs") or configurable logic block circuits ("CLBs"), and/or block random access memories ("BRAMs") or other programmably configurable hardware circuits. A programmable interconnect circuit 113 may include programmable internal routing circuit 103, and a programmable logic circuit 102 may be coupled to a programmable internal routing circuit 103.

An input interface 104 of programmable interconnect circuit 113 may be used to provide configuration, data, address, and/or control information or other information to a programmable internal routing circuit 103. An output interface 105 of programmable interconnect circuit 113 may be used to obtain configuration, data, address, and/or control information or other information from programmable internal routing circuit 103.

During factory testing programmable internal routing circuit 103 may be used to test for example a programmable logic circuit 102. An interface of a programmable internal routing circuit 103 and an associated programmable logic circuit 102 may referred to as an interconnect register or flip-flop interface ("IRI"), which may be shown separately from programmable internal routing circuit 113 for purposes of clarity and not limitation.

Programmable internal routing circuit 103 may include programmably configurable routing switches 101 and input configurable bypassable flip-flop circuits 116. Routing switches 101 may include corresponding programmably selectable interconnect lines of various lengths and bus widths. Routing switches 101 may include an output port 108 connected to input configurable bypassable flip-flop circuits 116. Input configurable bypassable flip-flop circuits may be programmably configured to be in a flip-flop mode or a bypass mode. Signal lines of output port 108 are interconnected to inputs of input configurable bypassable flip-flop circuits ("flip-flop circuits") 116.

Outputs of flip-flop circuits 116 are interconnected to nodes 125 for interconnecting outputs of input flip-flop circuits 116 to both input bus 109 and loopback branch 122. A loopback branch or bus 122 and a loopback or loopback MUX 123 allow for input on input bus 109 to be looped back to bypass programmable logic circuit 102.

Outputs of input flip-flop circuits 116 via nodes 125 may be connected to an input bus 109 of a programmable logic circuit 102. An output bus 107 of programmable logic circuit 102 may be connected to input port 110 of routing switches 101 through a loopback multiplexer or MUX 123.

Signal lines ("lines") interconnecting outputs of flip-flop circuits 116 to input bus 109 are respectively tapped at nodes or taps 125 for corresponding lines of a loopback branch 122. Loopback branch 122 feeds into an input port of loopback MUX 123, and thus loopback branch 122 may be used to interconnect outputs on output port 108 to an input port of loopback MUX 123 to bypass programmable logic circuit 102. Another input port of loopback MUX 123 is interconnected to output bus 107, and an output port of loopback MUX 123 is interconnected to input port 110 of routing switches 101.

Configuration memory, such as configuration random access memory ("CRAM") 112 may be coupled to a control select port 121 of loopback MUX 123 for selection of information on either output bus 107 or loopback branch 122 for output on an output port of loopback MUX 123. CRAM 112 may be a shared configuration memory, and thus be the same CRAM as described below with reference to FIGS. 4 and 5.

In IC 100, flip-flop circuits 116 may be included in programmable internal routing circuit 103. Example implementations of programmably configurable bypassable flip-flop circuits 116 are described in additional detail with reference to FIGS. 4 and 5.

Again, loopback branch 122 feeds into an input port of loopback MUX 123, and thus loopback branch 122 may be used to interconnect outputs on output port 108 to an input port of loopback MUX 123. Another input port of loopback MUX 123 is interconnected to output bus 107, and an output port of loopback MUX 123 is interconnected to input port 110 of routing switches 101. Configuration memory, such as CRAM 112, may be coupled to a control select port 121 of loopback MUX 123, as well as being connected to flip-flop circuits 116. CRAM 112 may be programmably configured to couple either input port of loopback MUX 123 to the output port of loopback MUX 123 to bypass or not bypass, respectively, output from programmable logic circuit 102.

As described herein loopback branch 122 and loopback MUX 123 may be used to implement a circuit design in programmable logic fabric, as well as being used for in factory testing. In the past, test structure resources embedded in programmable logic fabric were not available to a customer for purposes of implementing a circuit design. Moreover, in the past, resources associated with an unused or unselected programmable logic circuit 102 with respect to instantiation of a circuit design in programmable logic fabric were not available for use in such circuit design instantiation.

Figures 1, 2:
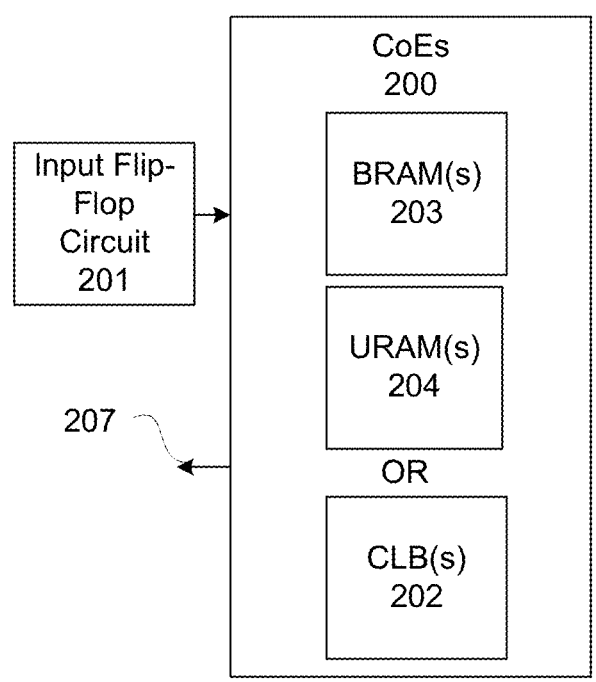
Figure 2:
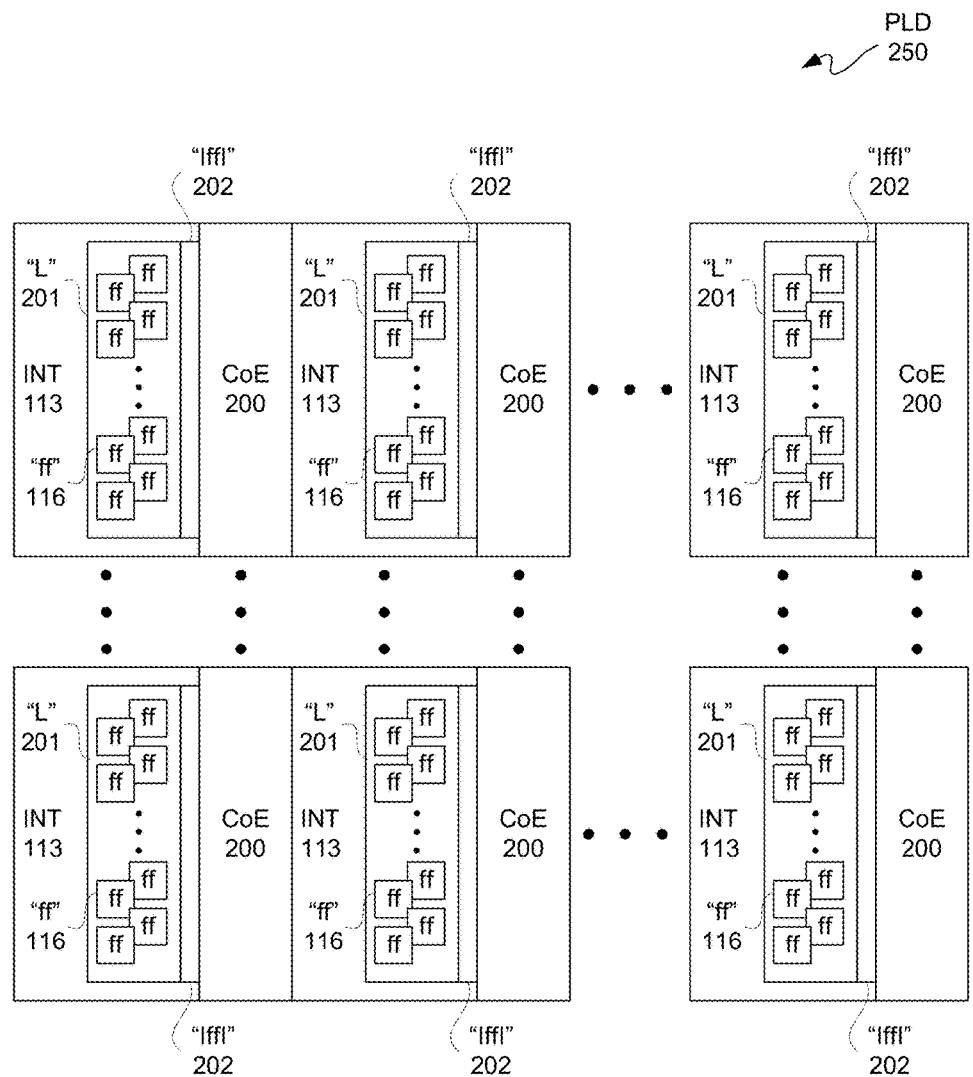

FIG. 2-1 is a block diagram depicting an exemplary set of programmably configurable elements ("CoEs") 200. Each CoE in CoEs 200 may be in a programmable logic circuit 102 of FIG. 1. In this example implementation, a CoE of CoEs 200 is associated with an input flip-flop circuit 201, which may include one or more of flip-flop circuits 116 of FIG. 1. CoEs 200 may be CLBs 202, BRAMs 203, and/or ultra-RAMs or URAMs 204, or other programmable logic circuit. A URAM is effectively RAMs, such as BRAMs, that may be concatenated to form memories of different sizes. These are just some examples of CoEs that may be in a field programmable gate array ("FPGA"), and accordingly these and/or other types of programmably configurable elements may be used in other implementations of an IC. Output from CoE 200 may be via an output bus 207, which for example may be output bus 107 of FIG. 1.

FIG. 2-2 is a block diagram depicting an exemplary PLD 250. In this example, PLD 250 includes columns of CoEs 200 and columns of INTs 113. Each CoE 200, such as a CLB for example, is associated with an INT 113. Each INT 113 includes flip-flop circuits 116 ("ff"). For purposes of clarity and not limitation, sets of flip-flop circuits 116 are denoted as a latch ("L") 201. An interconnect flip-flop interface ("IRI" or "Iffl") 202, namely an interface of INT 113 and an associated CoE 200, provides connections from flip-flop circuits 116 of a latch 201 to an associated CoE 200, which may or may not include outputs from such an associated CoE 200. Such flip-flop circuits 116 may though need not be programmably configured to be connected to one another to provide as an input register to a CoE 200.

Because one or more of the examples described herein may be implemented in a field programmable gate array ("FPGA"), a detailed description of such an IC is provided below. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 3:
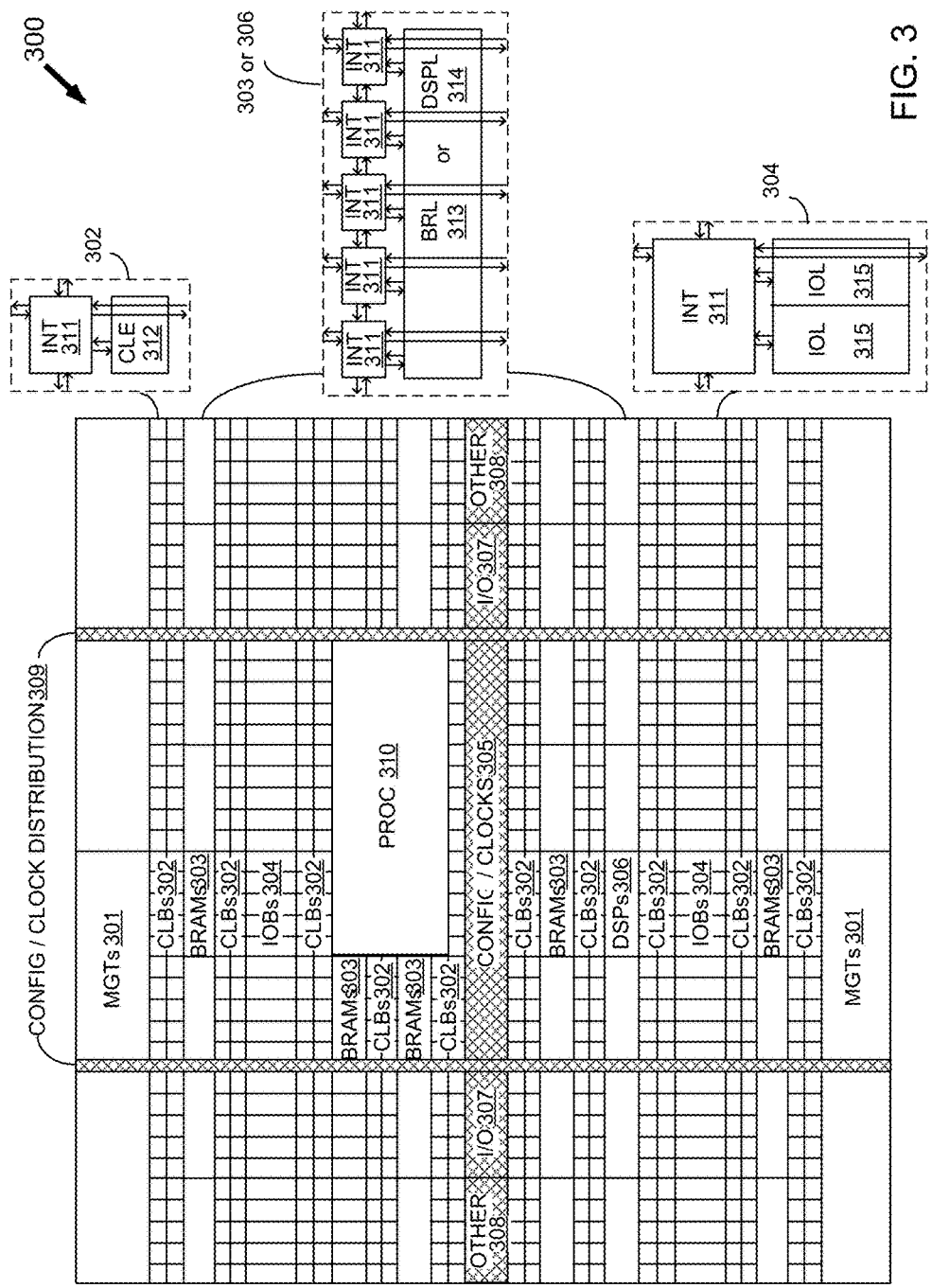
FIG. 3 is a simplified block diagram depicting an exemplary columnar FPGA architecture.

As noted above, advanced FPGAs can include several different types of programmable logic blocks in the array. For example, FIG. 3 illustrates an FPGA architecture 300 that includes a large number of different programmable tiles including multi-gigabit transceivers ("MGTs") 301, configurable logic blocks ("CLBs") 302, random access memory blocks ("BRAMs") 303, input/output blocks ("IOBs") 304, configuration and clocking logic ("CONFIG/CLOCKS") 305, digital signal processing blocks ("DSPs") 306, specialized input/output blocks ("I/O") 307 (e.g., configuration ports and clock ports), and other programmable logic 308 such as digital clock managers, analog-to-digital converters, system monitoring logic, and so forth. Some FPGAs also include dedicated processor blocks ("PROC") 310.

In some FPGAs, each programmable tile includes a programmable interconnect element ("INT") 311 having standardized connections to and from a corresponding interconnect element in each adjacent tile. Therefore, the programmable interconnect elements taken together implement the programmable interconnect structure for the illustrated FPGA. The programmable interconnect element 311 also includes the connections to and from the programmable logic element within the same tile, as shown by the examples included at the top of FIG. 3.

For example, a CLB 302 can include a configurable logic element ("CLE") 312 that can be programmed to implement user logic plus a single programmable interconnect element ("INT") 311. A BRAM 303 can include a BRAM logic element ("BRL") 313 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 306 can include a DSP logic element ("DSPL") 314 in addition to an appropriate number of programmable interconnect elements. An 10B 304 can include, for example, two instances of an input/output logic element ("IOL") 315 in addition to one instance of the programmable interconnect element 311. As will be clear to those of skill in the art, the actual I/O pads connected, for example, to the I/O logic element 315 typically are not confined to the area of the input/output logic element 315.

In the pictured embodiment, a horizontal area near the center of the die (shown in FIG. 3) is used for configuration, clock, and other control logic. Vertical columns 309 extending from this horizontal area or column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, processor block 310 spans several columns of CLBs and BRAMs.

Note that FIG. 3 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 3 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 4:
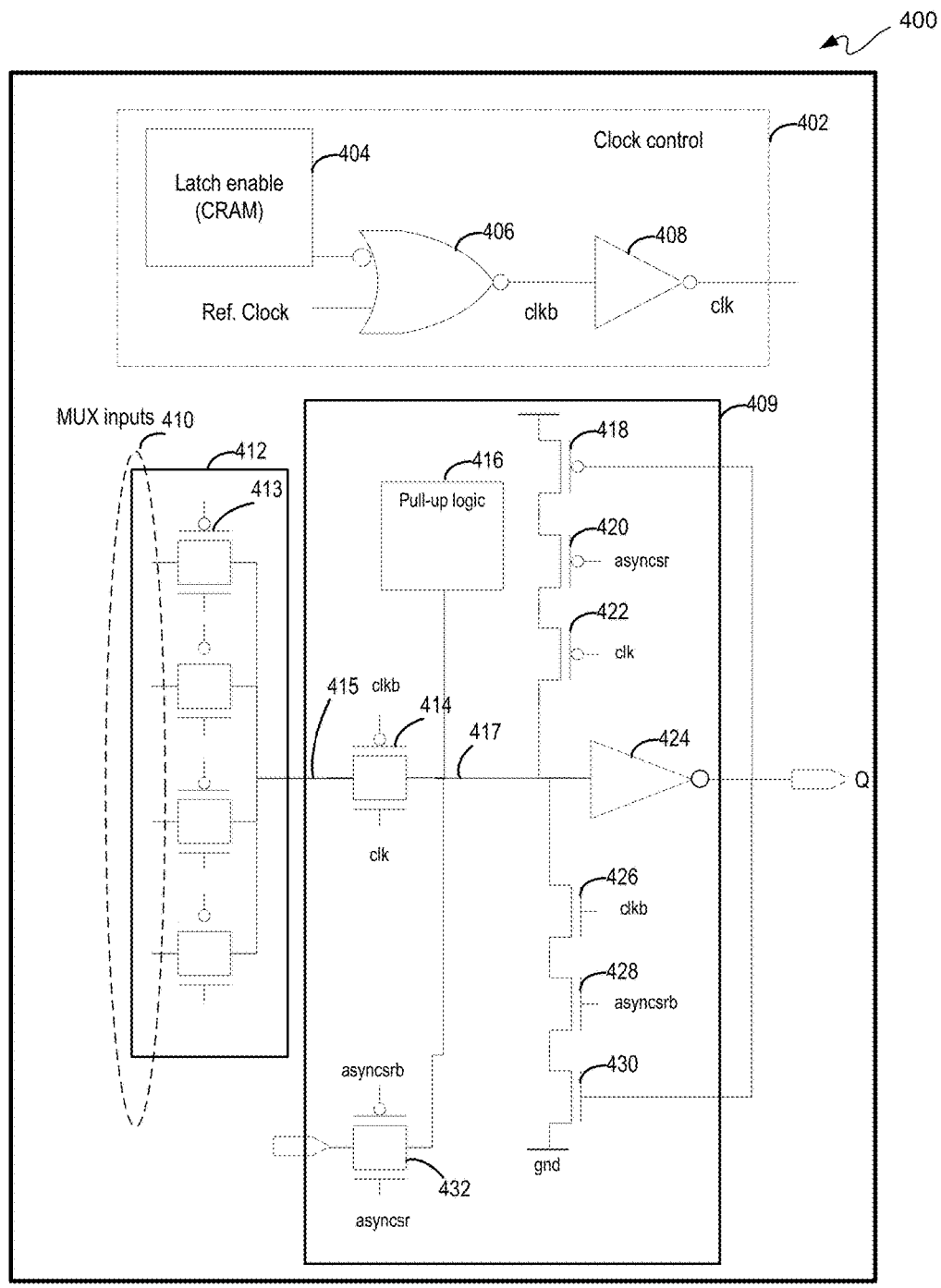
FIGS. 4 and 5 are block-circuit diagrams depicting respective exemplary configurable bypassable flip-flop circuits, which may be used for configurable bypassable flip-flop circuits of FIG. 1.
Figure 5:
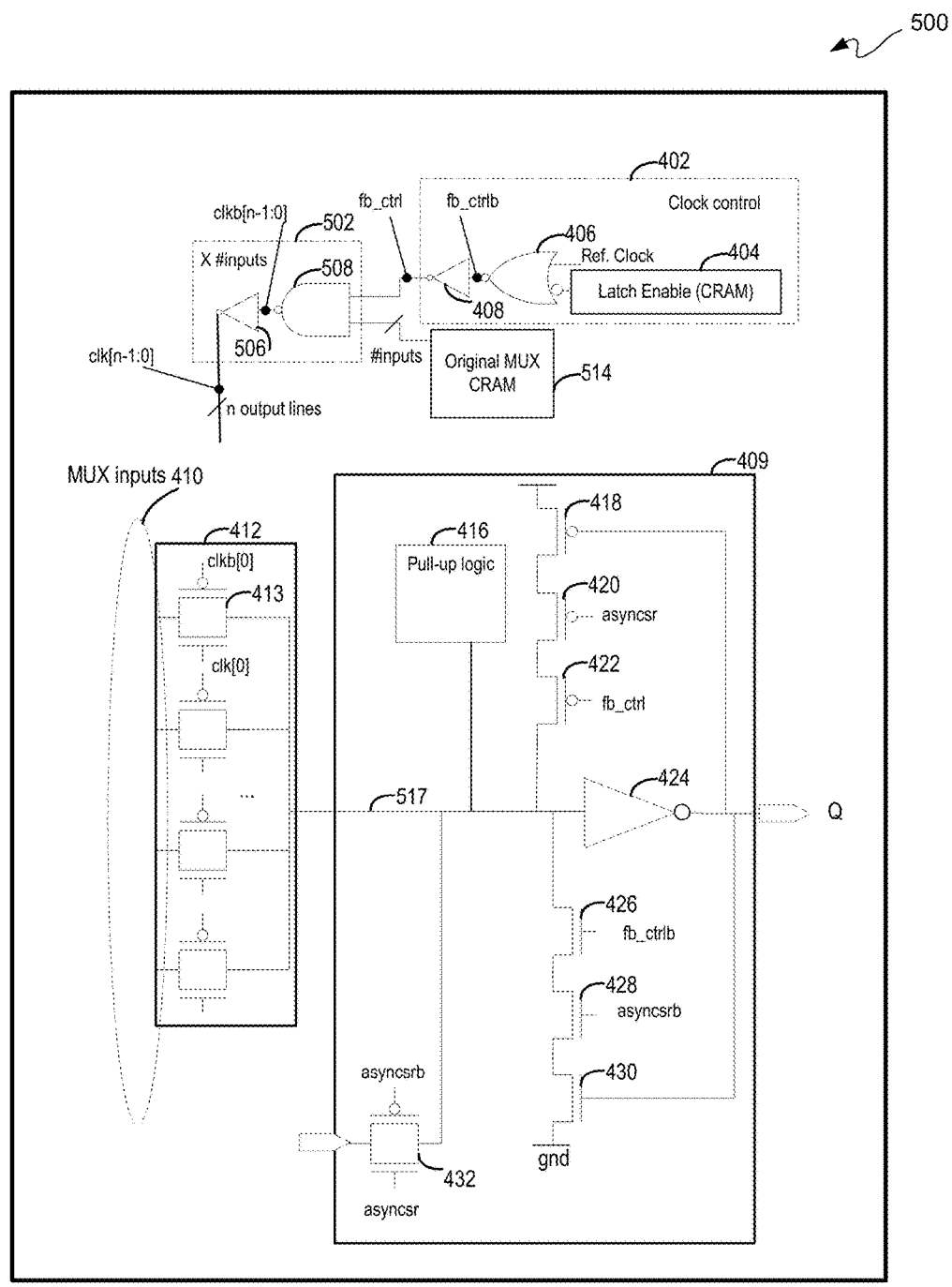

FIGS. 4 and 5 are block-circuit diagrams depicting respective exemplary multiplexer-latch circuits 400 and 500, either or both of which may be used to implement flip-flop circuits 116 of FIG. 1. These are just some example implementations of programmably configurable flip-flop circuits which may be used for flip-flop circuits 116, and other types of flip-flop circuits, such as an SR latch for example, consistent with the description herein may likewise be used. Along those lines, even though clock signals are described below, in other configurations of flip-flop circuits other signals, such a set and reset signals for example, may be used.

FIG. 4 depicts a circuit that functions as multiplexer-latch-based ("multiplexer-latch") circuit 400 with pass-through or registered output and that uses a pass-gate that is shared between inputs of a multiplexer thereof. According to various implementations, the depicted circuit can be used as part of an interconnect tile of a PLD device. The depicted circuit can operate in either of two modes by controlling a clock signal that enables a bypass circuit, shown as pulse-based pass-gate circuit 414. In particular, the clock control circuit 402 receives a configuration signal and a reference clock signal. The clock signal can be provided from a neighboring CLE block or from other clock sources. In particular implementations, the CLE clock can be provided by a time-borrowing circuit that generates pulses with a controllable duty cycle. When enabled by the configuration signal, clock control circuit 402 generates a differential signal pair (clk and clkb) from the reference clock signal.

CRAM 404 may include memory cells of CRAM 112 of FIG. 1 in addition to memory cells for multiplexer-latch circuits. Latch enable CRAM 404 provides the configuration signal which indicates whether or not output circuit 409 is in a latch mode or a pass-through mode. In the depicted circuit, a low ("0") configuration signal corresponds to a pass-through mode because the output (clkb) of the NOR gate 406 will then be low irrespective of the reference clock value. This output is then provided to an inverter buffer 408 to generate the clk signal which is used with the clkb signal to enable pass-gate circuit 414. When the combination of the clkb and clk signal remains active in this regard, any input signal received by pass-gate circuit 414 will be immediately passed to inverter buffer 424, which drives the output node Q. Accordingly, output circuit 409 is configured to operate in the pass-through mode.

When the configuration signal is high ("1"), the output of NOR gate 406 will be responsive to the reference clock. In particular, NOR gate 406 functions as an inverter buffer circuit. The result is that the clkb and clk signals will mirror the reference clock signal. Pass-gate circuit 414 will then control the timing for latching of data that is received from multiplexer circuit 412 by passing data depending upon the clk/clkb clock phase. In the depicted configuration, the input data is passed when clk=1 and clkb=0; and blocked when clk=0 and clkb=1.

The depicted multiplexer circuit 412 includes a set of pass-gate circuits 413 that when activated allow one of the multiplexer input signals 410 to be passed to a shared output node 415. The multiplexer function is controllable using a separate differential control signal for each of the pass-gates in the multiplexer circuit 412. In particular, the set of differential control signals will enable a selected pass-gate circuit while disabling the remaining pass-gate circuits.

Output circuit 409 includes a feedback circuit that drives a feedback path from the output of inverter buffer 424 to the input of inverter buffer 424. In particular, output node Q drives transistors 418 and 430. Transistors 418 and 430 are part of respective transistor stacks that form a feedback circuit. A first stack includes transistors 418, 420, 422, and a second stack includes transistors 426, 428, 430. The two transistor stacks collectively function as an inverter by providing either a pull-up or pull-down to node 417 which is connected to the input of inverter buffer 424. Accordingly, the combination of buffer 424 and the transistor stacks function as a latch that stores data received from pass-gate circuit 414.

When output circuit 409 is in a flip-flop mode, the clk and clkb signals latch the provided data by enabling the feedback circuit when pass-gate circuit 414 is disabled and a MUX input signal is not driving node 417. To avoid contention between the feedback circuit and the signal received from pass-gate circuit 414, the clk and clkb signals disable the feedback circuit when pass-gate circuit 414 is active and allow the input signal to drive node 417. Accordingly, output circuit 409 operates as a clocked latch by storing data received from a selected input of multiplexer inputs 410, where the timing for the storing is controlled by the phase of the clk/clkb signals.

According to various implementations, when output circuit 409 is in pass-through mode, the clk and clkb signals turn off transistors 422 and 426, respectively. This disables the feedback mode and output circuit 409 functions as a pass-through (buffer) circuit that does not latch received data.

Consistent with certain implementations, output circuit 409 can be configured to allow for asynchronous setting/resetting of stored data. In the depicted circuit, the differential SR signal pair asynchsr and asynchrsrb controls the asynchronous reset. When the differential reset signal is active, transistors 420 and 428 are turned off to disable the feedback path. At the same time, pass-gate circuit 432 is activated to set the value of the output circuit to a desired value, which could be either "0" or "1" depending upon whether the desired behavior is a set or a reset. When the differential reset signal is inactive, the pass-gate circuit 432 is disabled and the transistors 420 and 428 are enabled. In implementations where synchronous setting/resetting is desired, the SR signal can be synchronized to the reference clock signal (e.g., using an AND gate) before being provided to output circuit 409. In implementations where setting/resetting functionality is not desired, pass-gate 432 and transistors 420 and 428 can be removed from the circuit. According to various implementations, a pull-up logic circuit 416 can provide a pull-up to shared node 417.

Consistent with certain implementations, the differential clock signal pair (clk, clkb) provided by control circuit 402, and responsive to CRAM 404, can be shared across multiple multiplexer-latch circuits. The grouping and number of multiplexer-based circuits that share a single clock signal pair can vary according to the particular architecture. For instance, multiplexer-based circuits that are used as inputs to the same LUT can be grouped together because the timings and configurations are more likely to be the same. As an example, if one input to a LUT enables the latch mode for pipelining purposes, each of the inputs is likely to also be configured to enable the latch mode for pipelining purposes.

The circuit diagram depicted in FIG. 4 is provided as an example from which variations are possible. An example of such variations is discussed in connection with FIG. 5. Circuit components and blocks that provide similar functionality, relative to FIGS. 4 and 5, are identified using common reference numerals. For the sake of brevity, some of the descriptions from FIG. 4 are not repeated when discussing similar elements in FIG. 5.

FIG. 5 depicts a circuit that functions as multiplexer-latch based ("multiplexer-latch") circuit 500 with pass-through or registered modes by synchronous control of pass-gates for respective inputs of the multiplexer, consistent with implementations of the present disclosure. One manner in which the circuit of FIG. 5 differs from that of FIG. 4 is that pass-gate circuit 414 has been removed. In effect, the function provided by pass-gate circuit 414 has been moved to the individual pass-gates of multiplexer circuit 412. In certain instances, the removal of pass-gate circuit 414 reduces the load on the input data paths and thereby reduces signal routing delay. Moreover, each output circuit 409 contains one less pass-gate and takes up less physical real estate on an integrated circuit chip or die. Pass-gate circuit 414 provided synchronous control over input to the latch of output circuit 409. A similar synchronous control over data present on node 517 is provided using synchronous control of pass-gates 413. Node 517 serves both as the shared output node of multiplexer circuit 412 and the input to buffer circuit 424.

To control pass-gates 413 in a synchronous manner, additional control logic 502 generates sets of clock-synchronous multiplexer control signals (clk[ ], clkb[ ]). Each set of multiplexer control signals controls a corresponding pass-gate of multiplexer circuit 412. As discussed in connection with FIG. 4, clock control circuit 402 is responsive to a configuration signal (from latch enable CRAM 404) and a reference clock signal. The reference clock signal can be provided from a neighboring CLE block or from other clock sources. When enabled by the configuration signal, clock control circuit 402 generates a differential signal pair (fb_ctrl, fb_ctrlb) from the clock signal. The differential signal pair generated by clock control circuit 402 is used for controlling the feedback path of output circuit 409 but not for controlling pass-gates 413 of multiplexer circuit 412. Accordingly, FIG. 5 labels the differential signal pair as fb_ctrl and fb_ctrlb, whereas the similar signals that performed both functions and were labeled clk and clkb in FIG. 4.

Latch enable CRAM 404 provides the configuration signal, which indicates whether or not output circuit 409 is in a latch mode or a pass-through mode. In the particular depicted circuit, a low ("0") configuration signal corresponds to a pass-through mode because the output (clkb) of NOR gate 406 is low irrespective of the reference clock value. When the configuration signal is high ("1"), the output of NOR gate 406 will be responsive to the reference clock, and output circuit 409 will be in a flip-flop mode.

Control circuit 502 generates separate sets of differential signal pairs (clk[ ], clkb[ ]), which control the flow of data from MUX inputs 410 to the input to the latch of output circuit 409. Control circuit 502 is replicated for each separately controllable multiplexer input. For "n" inputs, this results in the generation of n differential signal pairs: clk[n−1:0], clkb[n−1:0]. To generate each signal pair, an AND gate 508 is used to gate each respective input based upon a corresponding control signal. An inverter buffer 506 then generates the complementary signal. For example, multiplexer circuit 412 could be a four-to-one multiplexer, with four MUX inputs and four pass-gates 413. Control circuit 502 is replicated four times. Each instance of control circuit 502 is linked to a different control signal, where each control signal represents the selection of a corresponding MUX input. To select the first input ([0]), the control signal [0] is set to a high ("1") value, while the remaining control signals [3:1] are set to a low ("0") value. The clk[3:1], clkb[3:1] signal pairs will be held static, due to the function of NAND gate 508, and at a value that disables corresponding pass-gates 413. The clk[0], clkb[0] signal pair will then be synchronously driven by the reference clock. The latch of output circuit 409 then latches data in a manner that is synchronous with the reference clock.

According to various implementations, the source of the control signals is MUX selection logic 514. In an FPGA/PLD environment, MUX selection logic 514 could be implemented as a CRAM, as one non-limiting example. For instance, a CRAM 514 could be programmed to select between multiple different MUX inputs 410 as part of a routing solution, such as where the circuit of FIG. 5 is part of an interconnection routing tile.

The removal of pass-gate circuit 414 can be useful for reducing loading on the data path that includes shared node 417/517. Reduction in loading can improve (reduce) signal delay or latency for the corresponding data path. It is noted that while the removal of pass-gate circuit 414 can save some physical space on an integrated circuit chip or die, the addition of control logic 502, which is replicated for each input, takes up additional physical area. The net result may be an increased use of physical space, particularly for wide multiplexer circuits with many inputs.

The circuits depicted in the preceding figures depict only a single output bit (Q) for simplicity. In certain implementations, multiple bits can be grouped together for selection purposes. For example, a data bus of width "x" can be formed from x multiplexer-latch circuits with a single control signal used to select the same input for each multiplexer in the group.

Figure 6:
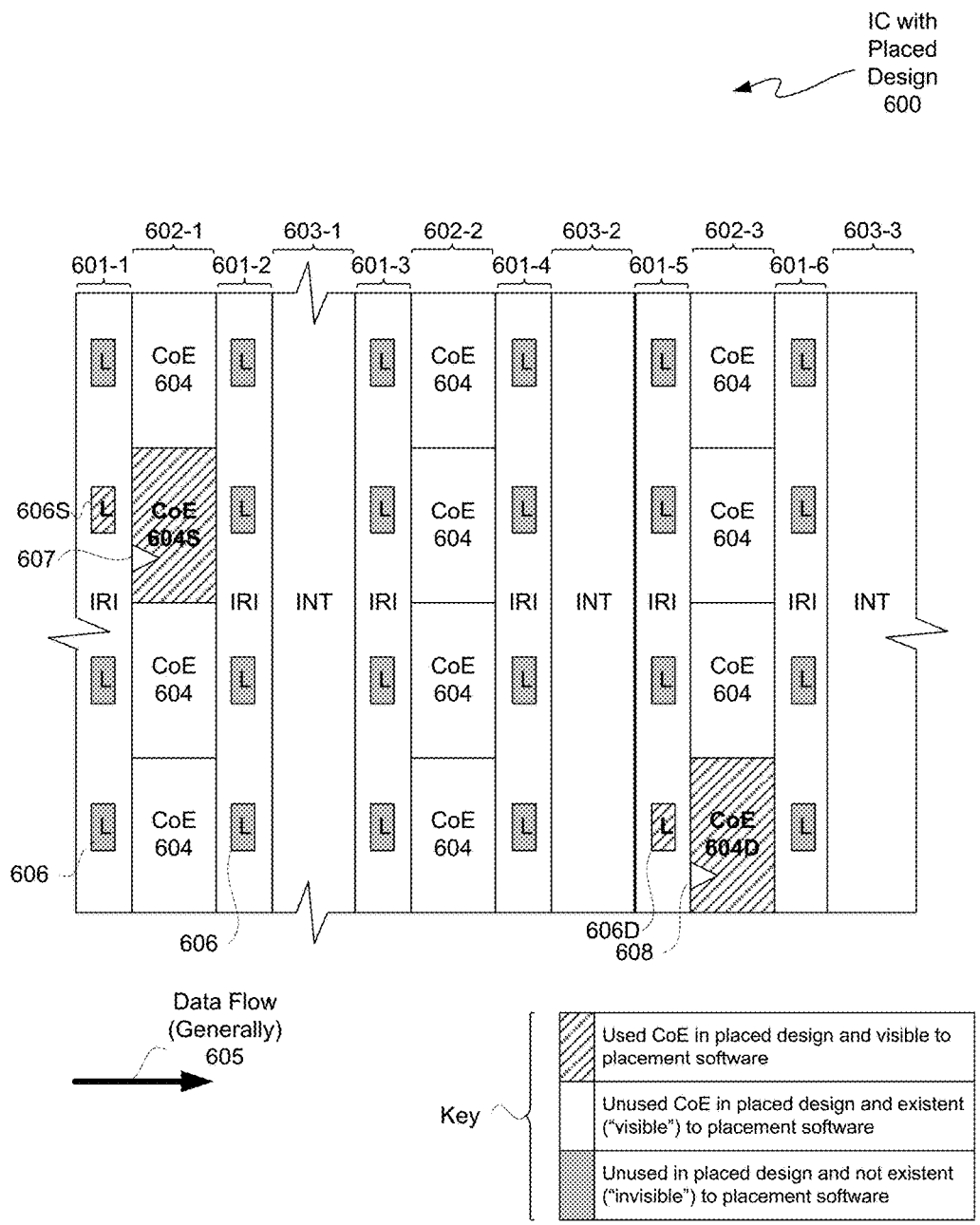
FIG. 6 is a block diagram depicting an exemplary IC with placed components for instantiation of a circuit design in such an IC.

FIG. 6 is a block diagram depicting an exemplary IC 600 with placed components for instantiation of a circuit design in IC 600. IC 600 may include programmable logic fabric, which programmable logic fabric includes columns of programmable IRI 601-1 through 601-6, CoE 602-1 through 602-3, and programmably configurable INTs 603-1 through 603-3. In this example implementation, an IRI column 601 is on both sides of a CoE column 602, and an INT column 603 is between IRI columns 601. However, in another implementation, different orderings of columns may be used. In this example, data flow is generally from left-to-right across the page, as generally indicated by arrow; however, in another example data flow may generally be in another direction. For purposes of clarity and not limitation, separate IRI columns 601 are illustratively depicted even though such IRI columns 601 may be parts of associated INT columns 603, as previously described for example with reference to FIG. 2-2.

A CoE column 602 may be composed of a stack of CoEs 604, such as a CoE 200 of FIG. 2 for example. In this example implementation, each CoE 604 has a corresponding latch circuit ("L") 606, which may be flip-flop circuits 116 of FIG. 1 or an input flip-flop circuit 201 of FIGS. 2-1 and 2-2. Latch circuits 606 are illustratively depicted as being in IRI columns 601 for purposes of clarity and not limitation. However, in another configuration, latch circuits 606 or other test structure circuits may be incorporated into either an associated CoE or an INT, or a portion in each. In this example implementation, each CoE 604 has associated therewith an input latch circuit 606 and no output latch circuit. However, in another implementation, each CoE 604 may include an output latch circuit 606 formed of flip-flop circuits 116 of FIG. 1 or both an input and an output latch circuit 606.

In this example, used CoEs 604 include a source CoE 604S and a destination CoE 604D, as generally indicated with diagonal cross-hatched lines. These placed CoEs 604S and 604D in a placed design are existent or "visible" to placement software. Accordingly, as used or placed CoEs 604, corresponding source latch circuit 606S and destination latch circuit 606D are available resources visible to placement software, and thus are likewise generally indicated with diagonal cross-hatched lines. Unused or unplaced CoEs, namely CoEs not selected for placement, are visible to placement software, but simply not selected, as generally indicated by white backgrounds. However, in the past, only elements in or associated with a CoE selected for placement, including test structure elements internal to or directly associated with a CoE, were available resources as recognized by placement software. Thus, in the past latch circuits 606 not used in a placed design were not existent or "invisible" with respect to placement software, as indicated by shaded boxes for such unplaced input latch circuits 606.

For this implementation, this meant that only input latch circuits 606S and 606D were recognized by placement software, this limited recognition affected design and routing opportunities. For example, CoEs 604S and 604D may be clocked, as generally indicated by corresponding clock ports 607 and 608, respectively, and thus a pipeline between CoEs 604S and 604D was limited to input latch circuit 606D, unless other CoEs were wholly selected for placement.

Figure 7:
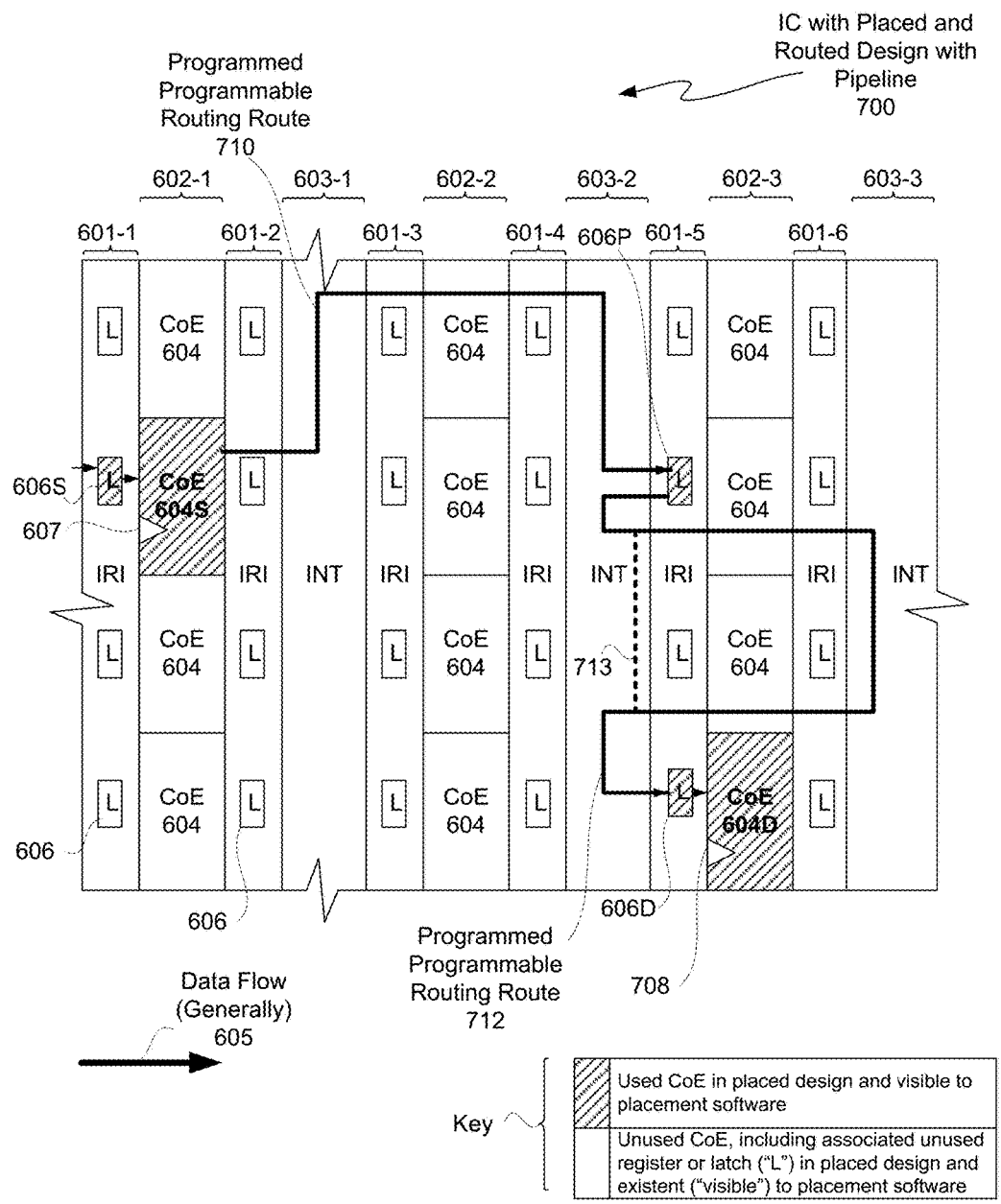
FIG. 7 is a block diagram depicting the exemplary IC of FIG. 6 though with placed and routed components for instantiation of a circuit design in such an IC.

FIG. 7 is a block diagram depicting an exemplary IC 700 with placed and routed components for instantiation of a circuit design in IC 700. IC 700 may be IC 600 of FIG. 7 though with routings between placed components and with recognized unused flip-flop circuits. In FIG. 7, input latch circuits 606 of unused CoEs 604 are recognized by placement software and thus routing software. In other words, rather than designating all components of an unused CoE 604 as being unavailable for placement, input latch circuits 606 are considered available for placement even though such input latch circuits 606 belong to unused CoEs 604. Along those lines, such input latch circuits 606 belonging to CoEs 604 not used in a placement may be considered part of IRI columns 601 for purposes of visibility to placement software and thus routing software.

In this example, a programmed programmable route 710 is configured to route information from CoE 604S to input latch circuit 606P belonging to an unplaced CoE 604 to insert a pipeline flip-flop or pipeline registered stage between placed CoE 604S and input latch circuit 606D belonging to placed CoEs 604D. Programmed programmable route 710 generally routes information in direction 605.

With additional reference to FIG. 1, because IRI 601-5 has a loopback branch and a loopback MUX, such as loopback branch 122 and loopback MUX 123, an unused CoE 604 having input latch circuit 606P may be bypassed. This allows output of input latch circuit 606P to be looped back to routing switches 101 in a programmable internal routing circuit 103. Programmable internal routing circuit 103 is an IRI circuit, and one or more input flip-flop circuits 116 are considered part of such an IRI column 601. Information looped back from output of input latch circuit 606P to an associated loopback MUX 123 and to routing switches 101 may be output from routing switching via output interface 105.

Such looped back information may be routed via programmed programmable routing route 712 forward in direction 605 to an INT column, such as INT column 603-3 in this example. From INT column 603-3, such looped-back information may be routed in a direction opposite direction 605, namely routed backwards for input to input multiplexer-latch circuit 606D. Optionally, with a capability afforded by availability for placement of input multiplexer-latch circuits 606 of unplaced CoEs 604 and by addition of a loopback branch 122 to a loopback MUX 123, one or more circuits of INT columns 603 may optionally include an INT bypass path 713 from going more directly from one input multiplexer-latch circuit to another, namely by staying within a same INT column nearest such input multiplexer-latch circuits.

An added ability to insert pipeline stages using one or more previously unavailable flip-flop circuits may improve performance of high-speed applications and/or provide additional capacity to fix hold violations. Fixing hold violations may facilitate time-borrowing techniques to achieve higher performance both on high-speed and legacy applications. Extra pipelining and/or extra pipelining stages in a pipeline is an effective way to improve performance of FPGA applications. For example, by introducing flip-flops on critical timing paths and/or reducing effective number of gates and wire distance that a signal has to traverse in one clock cycle, a maximum frequency of operation may be increased. Time-borrowing can improve performance of circuits by essentially borrowing available positive slack in one pipeline stage to compensate for negative slack in another pipeline stage. For example, time may be intentionally added to a clock signal arriving at a middle pipeline registered flip-flop stage to relax a timing constraint on a prior pipeline registered flip-flop stage and to tighten a timing constraint on a latter pipeline flip-flop stage. Accordingly, placement constraints may be relaxed by an ability to add "pipeline" flip-flops previously not available.

Figure 8:
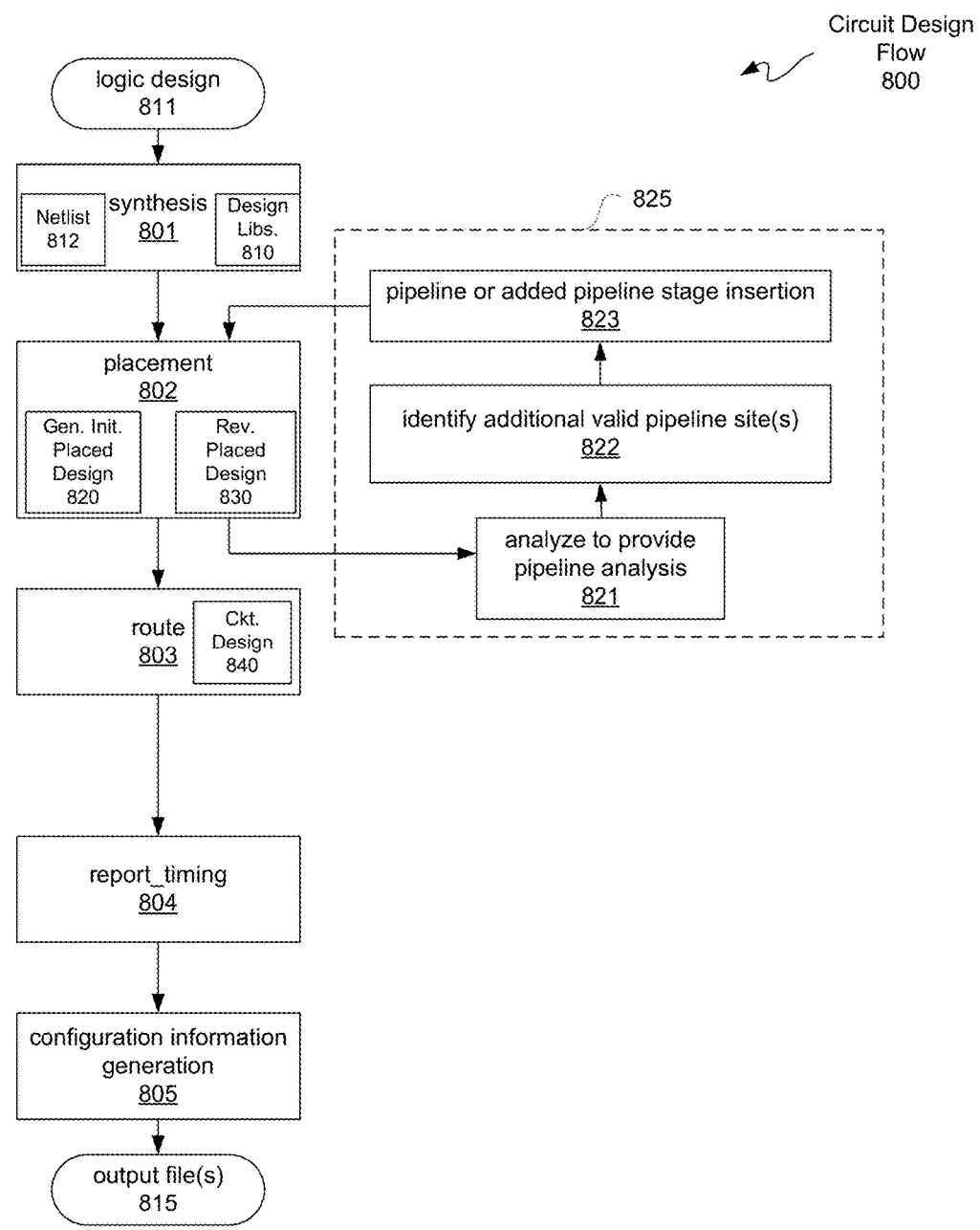
FIG. 8 is a flow diagram depicting an exemplary computer aided circuit design flow for generating a circuit design for instantiation in an IC, such as the IC of FIG. 1 for example.

FIG. 8 is a flow diagram depicting an exemplary computer aided circuit design flow 800 for generating a circuit design for instantiation in an integrated circuit, such as IC 100 of FIG. 1 for example. Along those lines, such an integrated circuit may be a PLD or other IC with programmably configurable circuitry fabric. With simultaneous reference to FIGS. 1 through 8, computer aided circuit design flow 800 is further described.

A logic design 811 may be provided to a computer aided design engine for synthesizing at 801. Such a computer aided design engine, which may be configured in software and/or hardware, may access one or more design libraries 810 for such synthesis. For purposes of clarity by way of example and not limitation, computer aided design ("CAD") engine is a CAD programmed computing device 1010; however, in another implementation a CAD engine may be located in a cloud computing system. At 801, a logic design 811 synthesized may be used to generate a netlist 812. This providing of a logic design 811 may be to a local workstation, to a remote server such as in a cloud-based computing system, or a combination thereof.

At 802, components identified in netlist 812 generated at 801 may be placed to map such identified components to circuits, such as for example programmably configurable circuits, of an identified integrated circuit, such as IC 100. In this example, operation at 802 generates an initial placement of such components identified, namely initially placed design 820. However, this initially placed design 820 does not include one or more flip-flop circuits 116 of corresponding unplaced circuits. For example, a latch circuit 606 of an unplaced CoE 604 in this example implementation is not included in this initially placed design 820.

To revise initially placed design ("initial placement") 820, a subroutine or other pipeline revisioning or provisioning sequence 825 may be invoked or called up. Along those lines, at 802 operations 821 through 823 of sequence 825 may be performed to generate a revised placed design ("revised placement") 830 with respect to initial placement 820.

At 821, such initial placement 820 may be analyzed for pipelining. This pipeline analysis may indicate benefits to adding one or more pipelines and/or to enhance one or more existing pipeline circuits ("pipelines"). Such pipeline analysis may indicate generally where one or more pipeline flip-flop stages may be added, how to borrow time using such one or more added pipeline flip-flop stages, and/or other applications for adding one or more pipeline flip-flop stages to initial placement 820. In other words, such one or more added flip-flops sites are not for flip-flops in netlist 812, but rather are added components to an initial placement.

At 822, additional valid pipeline site(s) may be identified responsive to the pipeline analysis as compared with available circuits of unplaced circuits. At 822, a site may be identified for insertion of a flip-flop circuit 116 into initial placement 820 for such multiplexer-latch circuit being associated with an unplaced circuit of circuits of initial placement 820. For example, one or more valid pipeline sites may be identified for purposes of adding one or more pipeline flip-flop stages, such as by addition of one or more pipeline flip-flops, to form or lengthen pipelines.

Figure 9:
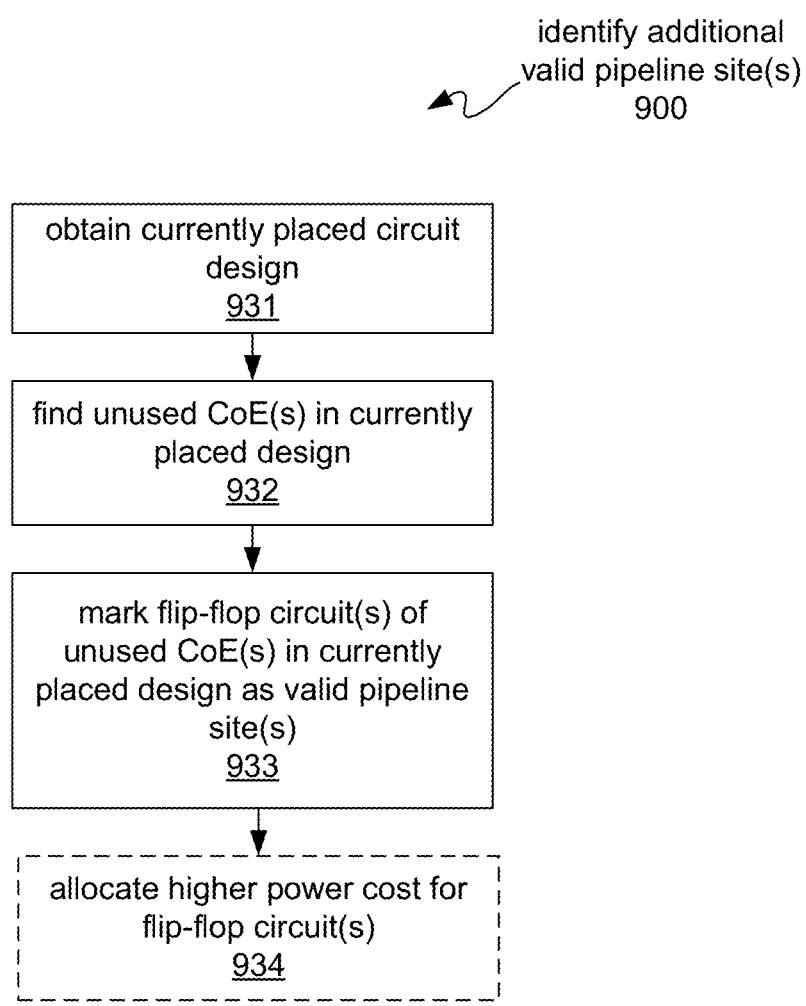
FIG. 9 is a flow diagram depicting an exemplary pipeline site identification flow, which may be used in the computer aided circuit design flow of FIG. 8.

FIG. 9 is a flow diagram depicting an exemplary pipeline site identification flow 900, which may be used at operation 822. At 931 an initial or current placement 820 of a circuit design may be obtained. At 932, one or more unused CoEs 604 in such initial or current placement 820 with respect to a target IC 100 for such placement may be found or identified. There may be many types of IC, such as many types of PLDs for example, and so a target IC or target family of ICs may be used for purposes of placing resources. For purposes of clarity by way of non-limiting example, it shall be assumed that IC 100 is a PLD.

Using pipeline analysis of operation 821, locations may be marked at 933 for addition of one or more flip-flops, such as for example multiplexer-latch circuits 606, of such unused CoEs 604 identified at 932. These marked locations are valid pipeline sites which may be added to an initial or currently placed circuit design, such as for example placement 820.

An unused CoE 604 may draw more power when a multiplexer-latch circuit 606 associated therewith or thereof is used in a placement than compared when such multiplexer-latch circuit 606 of such unused CoE 604 is not used in a placement. Along those lines, optionally at 934 an incrementally higher power cost may be allocated for each flip-flop, such as for example each multiplexer-latch circuit 606, of each unused CoE 604 added into a placed circuit design, such as for example placement 820.

Returning to FIG. 8, at 823 a pipeline may be added or lengthened to initial placement 820 to provide a revised placement 830. For example, a flip-flop circuit 116 may be inserted into a site identified at 822 to add to initial placement 820 responsive to a pipeline analysis obtained at 821 to provide a revised placement 830. In accordance with the above description, inserting a flip-flop circuit 116 may insert a pipeline into an initial placement 820 or inserts a flip-flop into an existing pipeline of initial placement 820.

At 803, a computer aided design engine may be configured to route revised placement 830 to provide a circuit design 840 for logic design 811. At 804, such circuit design 840 may be analyzed for timing consideration to report timing, namely to generate a timing report for circuit design 840. This operation may be used to confirm a circuit design 840 meets timing parameters for logic design 811. However, addition of pipelining as described above may enhance ability of a circuit design 840 to meet timing parameters.

At 805, configuration information may be generated for circuit design 840. For example, bitgen or another tool may be used to generate one or more configuration bitstreams to configure IC 100 to instantiate circuit design 840. Such configuration information may be output as one or more configuration output files which may be used to instantiate circuit design 840 in IC 100. Along those lines, a configuration file includes configuration information to programmably configure CRAM to configure a flip-flop circuit 116 as a flip-flop and to configure an associated output multiplexer 123 coupled to such flip-flop circuit 116 through a loopback branch 122 to output data directly from such flip-flop circuit to routing switches 101. In other words, such configuration information for output multiplexer 123 effectively bypasses an unplaced programmable logic circuit 102 directly coupled to multiplexer latch circuit 116.

Figure 10:
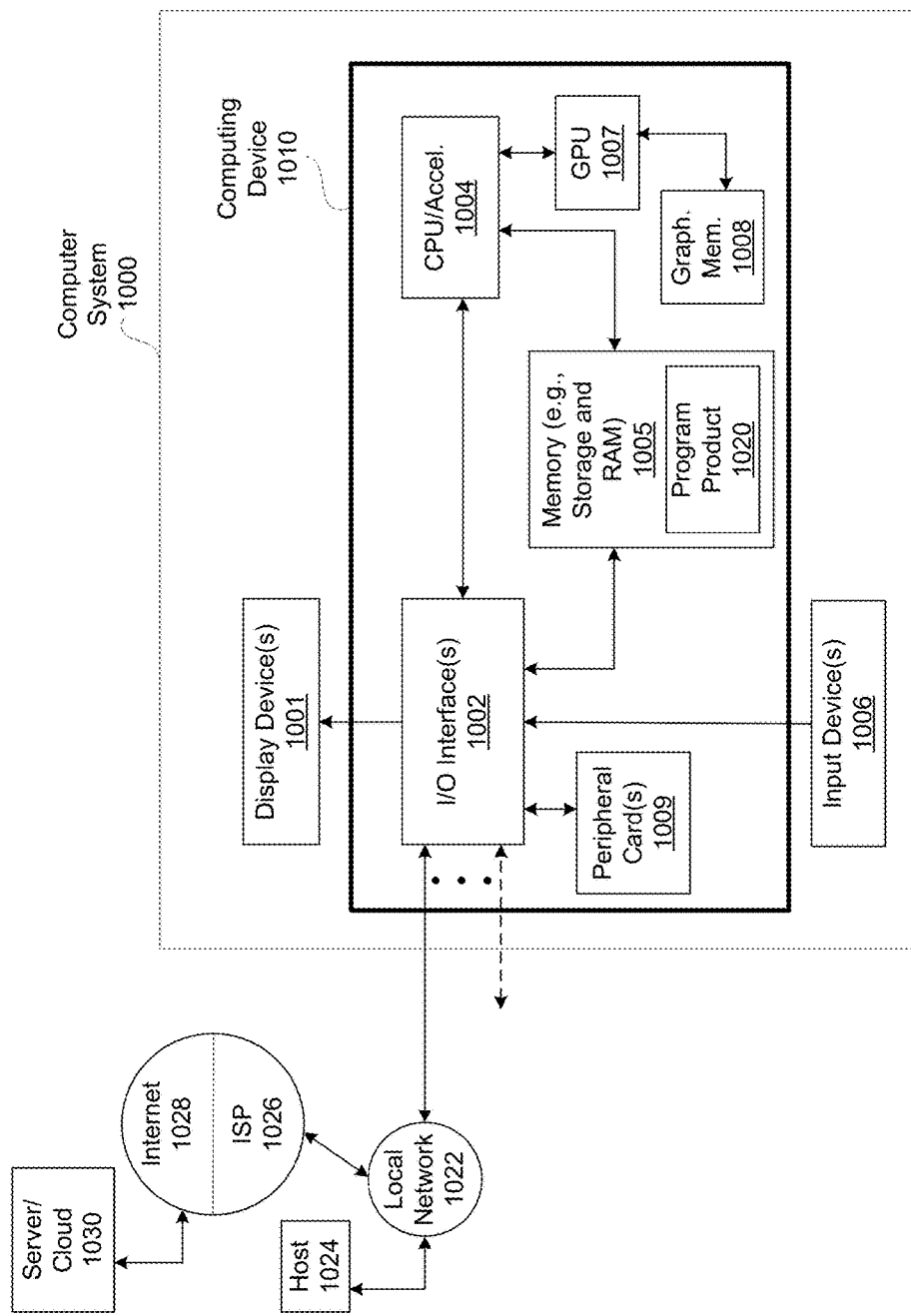
FIG. 10 is a block diagram depicting an exemplary computer system upon which one or more aspects described herein may be implemented.

In accordance with the above description, a computer aided design program may be recorded in a non-transitory machine-readable recording medium which performs circuit design flow 800. In accordance with the above description, a computer aided design engine may be part of a system for computer aided design. Along each of those lines, FIG. 10 is a block diagram depicting an exemplary computer system 1000 upon which one or more aspects described herein may be implemented. Computer system 1000 may include a programmed computing device 1010 coupled to one or more display devices 1001, such as Cathode Ray Tube ("CRT") displays, plasma displays, Liquid Crystal Displays ("LCDs"), Light Emitting Diode ("LED") displays, light emitting polymer displays ("LPDs") projectors and to one or more input devices 1006, such as a keyboard and a cursor pointing device. Other known configurations of a computer system may be used. Computer system 1000 by itself or networked with one or more other computer systems 1000 may provide an information handling system.

Programmed computing device 1010 may be programmed with a suitable operating system, which may include Mac OS, Java Virtual Machine, Real-Time OS, Linux, Solaris, iOS, Darwin, Android Linux-based OS, OS-X, Unix, or a Windows operating system, among other platforms, including without limitation an embedded operating system, such as VxWorks. Programmed computing device 1010 includes a central processing unit ("CPU") 1004, one or more memories and/or storage devices ("memory") 1005, and one or more input/output ("I/O") interfaces ("I/O interface") 1002. Programmed computing device 1010 may optionally include a graphics processing unit ("GPU") 1007 coupled to CPU 1004 and one or more peripheral cards 1009 coupled to I/O interface 1002. Along those lines, programmed computing device 1010 may include graphics memory 1008 coupled to optional GPU 1007.

CPU 1004 may be a type of microprocessor known in the art, such as available from IBM, Intel, ARM, and Advanced Micro Devices for example. CPU 1004 may include one or more processing cores. Support circuits (not shown) may include busses, cache, power supplies, clock circuits, data registers, and the like. However, an FPGA or other SoC accelerator 1004 including one or more processing cores may be used.

Memory 1005 may be directly coupled to CPU 1004 or coupled through I/O interface 1002. At least a portion of an operating system may be disposed in memory 1005. Memory 1005 may include one or more of the following: flash memory, random access memory, read only memory, magneto-resistive read/write memory, optical read/write memory, cache memory, magnetic read/write memory, and the like, as well as non-transitory signal-bearing media as described below. For example, memory 1005 may include an SSD, which is coupled to I/O interface 1002, such as through an SATA bus or other bus. Moreover, one or more SSDs may be used, such as for RAID or other multiple drive storage for example.

I/O interface 1002 may include chip set chips, graphics processors, and/or daughter cards, among other known circuits. In this example, I/O interface 1002 may be a Platform Controller Hub ("PCH"). I/O interface 1002 may be coupled to a conventional keyboard, network, mouse, camera, microphone, display printer, and interface circuitry adapted to receive and transmit data, such as data files and the like.

Programmed computing device 1010 may optionally include one or more peripheral cards 1009. An example of a daughter or peripheral card may include a network interface card ("NIC"), a display interface card, a modem card, and a Universal Serial Bus ("USB") interface card, among other known circuits. Optionally, one or more of these peripherals may be incorporated into a motherboard hosting CPU 1004 and I/O interface 1002. Along those lines, GPU 1007 may be incorporated into CPU 1004 and/or may be of a separate peripheral card.

Programmed computing device 1010 may be coupled to a number of client computers, server computers, or any combination thereof via a conventional network infrastructure, such as a company's Intranet and/or the Internet, for example, allowing distributed use. Moreover, a storage device, such as an SSD for example, may be directly coupled to such a network as a network drive, without having to be directly internally or externally coupled to programmed computing device 1010. However, for purposes of clarity and not limitation, it shall be assumed that an SSD is housed in programmed computing device 1010.

With continuing reference to FIG. 10 and additional reference to FIG. 8, computer system 1000 is further described. Memory 1005 may store all or portions of one or more programs or data, including variables or intermediate information during execution of instructions by CPU 1004, to implement processes in accordance with one or more embodiments hereof to provide program product 1020. For example, memory 1005 may store logic design 811, netlist 812, design libraries 810, initial placement 820, revised placement 830, circuit design 840, and/or output files 815. Program product 1020 may be for implementing portions of process flows, as described herein. Additionally, those skilled in the art will appreciate that one or more embodiments hereof may be implemented in hardware, software, or a combination of hardware and software. Such implementations may include a number of processors or processor cores independently executing various programs, dedicated hardware and/or programmable hardware. For example, an FPGA-accelerator may be configured to provide one or more portions of process flows described herein. Generally, a programmed computing device 1010 may be thought of as having a computer aided design engine in a form of CPU or accelerator 1004 in communication with memory 1005 as described herein.

Along those lines, implementations related to use of computing device 1010 for implementing techniques described herein may be performed by computing device 1010 in response to CPU 1004 executing one or more sequences of one or more instructions contained in main memory of memory 1005. Such instructions may be read into such main memory from another machine-readable medium, such as a storage device of memory 1005. Execution of the sequences of instructions contained in main memory may cause CPU 1004 to perform one or more process steps described herein. In alternative implementations, hardwired circuitry may be used in place of or in combination with software instructions for such implementations. Thus, the example implementations described herein should not be considered limited to any specific combination of hardware circuitry and software, unless expressly stated herein otherwise. Memory storage 1005 may be configured to store a logic design 811, design libraries 810, a netlist 812, an initial placement 820, a revised placement 830, a circuit design 840, and output files 815.

One or more program(s) of program product 1020, as well as documents thereof, may define functions of embodiments hereof and can be contained on a variety of non-transitory tangible signal-bearing media, such as computer- or machine-readable media having code, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or flash drive or hard-disk drive or read/writable CD or read/writable DVD).

Computer readable storage media encoded with program code may be packaged with a compatible device or provided separately from other devices. In addition program code may be encoded and transmitted via wired optical, and/or wireless networks conforming to a variety of protocols, including the Internet, thereby allowing distribution, e.g., via Internet download. In implementations, information downloaded from the Internet and other networks may be used to provide program product 1020. Such transitory tangible signal-bearing media, when carrying computer-readable instructions that direct functions hereof, represent implementations hereof.

Along those lines the term "tangible machine-readable medium" or "tangible computer-readable storage" or the like refers to any tangible medium that participates in providing data that causes a machine to operate in a specific manner. In an embodiment implemented using computer system 1000, tangible machine-readable media are involved, for example, in providing instructions to CPU 1004 for execution as part of programmed product 1020. Thus, a programmed computing device 1010 may include programmed product 1020 embodied in a tangible machine-readable medium. Such a medium may take many forms, including those describe above. Furthermore, computer device 1010 may itself be part of a cloud-based computing system, such as server/cloud 1030, where logic design 811 is communicated up to such computer device 1010 and configuration output files 815 are communicated down to a workstation. Moreover, for large logic designs 811, multiple servers may be used.

The term "transmission media", which includes coaxial cables, conductive wire and fiber optics, including traces or wires of a bus, may be used in communication of signals, including a carrier wave or any other transmission medium from which a computer can read. Transmission media can also take the form of acoustic or light waves, such as those generated during radio-wave and infra-red data communications.

Various forms of tangible signal-bearing machine-readable media may be involved in carrying one or more sequences of one or more instructions to CPU 1004 for execution. For example, instructions may initially be carried on a magnetic disk or other storage media of a remote computer. The remote computer can load the instructions into its dynamic memory and send such instructions over a transmission media using a modem. A modem local to computer system 1000 can receive such instructions on such transmission media and use an infra-red transmitter to convert such instructions to an infra-red signal. An infra-red detector can receive such instructions carried in such infra-red signal and appropriate circuitry can place such instructions on a bus of computing device 1010 for writing into main memory, from which CPU 1004 can retrieve and execute such instructions. Instructions received by main memory may optionally be stored on a storage device either before or after execution by CPU 1004.

Computer system 1000 may include a communication interface as part of I/O interface 1002 coupled to a bus of computing device 1010. Such a communication interface may provide a two-way data communication coupling to a network link connected to a local network 1022. For example, such a communication interface may be a local area network ("LAN") card to provide a data communication connection to a compatible LAN. Wireless links may also be implemented. In any such implementation, a communication interface sends and receives electrical, electromagnetic or optical signals that carry digital and/or analog data and instructions in streams representing various types of information.

A network link to local network 1022 may provide data communication through one or more networks to other data devices. For example, a network link may provide a connection through local network 1022 to a host computer 1024 or to data equipment operated by an Internet Service Provider ("ISP") 1026 or other Internet service provider. ISP 1026 may in turn provide data communication services through a world-wide packet data communication network, the "Internet" 1028. Local network 1022 and the Internet 1028 may both use electrical, electromagnetic or optical signals that carry analog and/or digital data streams. Data carrying signals through various networks, which carry data to and from computer system 1000, are exemplary forms of carrier waves for transporting information.

Wireless circuitry of I/O interface 1002 may be used to send and receive information over a wireless link or network to one or more other devices' conventional circuitry such as an antenna system, an RF transceiver, one or more amplifiers, a tuner, one or more oscillators, a digital signal processor, a CODEC chipset, memory, and the like. In some implementations, wireless circuitry may be capable of establishing and maintaining communications with other devices using one or more communication protocols, including time division multiple access (TDMA), code division multiple access (CDMA), global system for mobile communications (GSM), Enhanced Data GSM Environment (EDGE), wideband code division multiple access (W-CDMA), Long Term Evolution (LTE), LTE-Advanced, WiFi (such as IEEE 202.11a, IEEE 202.11b, IEEE 202.11g and/or IEEE 202.11n), Bluetooth, Wi-MAX, voice over Internet Protocol (VoIP), near field communication protocol (NFC), a protocol for email, instant messaging, and/or a short message service (SMS), or any other suitable communication protocol. A computing device can include wireless circuitry that can communicate over several different types of wireless networks depending on the range required for the communication. For example, a short-range wireless transceiver (e.g., Bluetooth), a medium-range wireless transceiver (e.g., WiFi), and/or a long range wireless transceiver (e.g., GSM/GPRS, UMTS, CDMA2000, EV-DO, and LTE/LTE-Advanced) can be used depending on the type of communication or the range of the communication.

Computer system 1000 can send messages and receive data, including program code, through network(s) via a network link and communication interface of I/O interface 1002. In the Internet example, a server 1030 might transmit a requested code for an application program through Internet 1028, ISP 1026, local network 1022 and I/O interface 1002. Received code may be executed by processor 1004 as it is received, and/or stored in a storage device, or other non-volatile storage, of memory 1005 for later execution. In this manner, computer system 1000 may obtain application code in the form of a carrier wave.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An integrated circuit having programmable logic fabric, the integrated circuit comprising:
    a configurable bypassable flip-flop circuit configured to transfer information from programmable internal routing to an input bus of a programmable logic circuit;
    a loopback branch connected to the input bus to bypass the programmable logic circuit; and
    a multiplexer having a first input port connected to the loopback branch, a second input port connected to an output bus of the programmable logic circuit, and an output port connected to routing switches of the programmable internal routing;
    the multiplexer configured to electrically couple the first input port or the second input port to the output port.

2. The integrated circuit according to claim 1, wherein the multiplexer is connected to configuration random access memory to programmably configure the multiplexer.

3. The integrated circuit according to claim 2, wherein the configurable bypassable flip-flop circuit is connected to the configuration random access memory to programmably configure the configurable bypassable flip-flop circuit.

4. The integrated circuit according to claim 1, wherein the configurable bypassable flip-flop circuit is programmably configurable as a clocked flip-flop.

5. The integrated circuit according to claim 4, wherein the configurable bypassable flip-flop circuit is of a pipeline circuit.

6. The integrated circuit according to claim 1, wherein the multiplexer is programmably configured to electrically couple the first input port to the output port to bypass the programmable logic circuit.

7. A method for computer aided circuit design, the method comprising:
    synthesizing a logic design to generate a netlist; and
    placing components identified in the netlist to map to circuits of an integrated circuit, the placing comprising:
        generating an initial placement of the components;
        analyzing the initial placement to provide a pipeline analysis;
        identifying a site for insertion of a configurable bypassable flip-flop circuit into the initial placement responsive to the pipeline analysis for an unplaced circuit of the integrated circuit with respect to the components placed in the initial placement; and
        inserting the configurable bypassable flip-flop circuit into the site to provide a revised placement.

8. The method according to claim 7, wherein the inserting the configurable bypassable flip-flop circuit performs inserting a pipeline into the initial placement.

9. The method according to claim 7, wherein the inserting the configurable bypassable flip-flop circuit performs inserting a flip-flop into a pipeline of the initial placement.

10. The method according to claim 7, further comprising:
    routing the revised placement to provide a circuit design for the logic design; and
    generating a configuration file to instantiate the circuit design in the integrated circuit.

11. The method according to claim 10, wherein the integrated circuit is a Programmable Logic Device.

12. The method according to claim 10, wherein the configuration file includes configuration information to configure:
    the configurable bypassable flip-flop circuit as a clocked flip-flop; and a multiplexer coupled to the configurable bypassable flip-flop circuit through a loopback branch to output data directly from the clocked flip-flop.

13. The method according to claim 12, wherein the configuration information for the multiplexer bypasses the unplaced circuit.

14. The method according to claim 13, wherein the unplaced circuit is a programmable logic circuit.

15. A computer aided design program recorded in a non-transitory machine-readable recording medium which performs the method according to claim 10.

16. A method for pipeline site identification in an integrated circuit, the method comprising:
   obtaining a placed circuit design with respect to the integrated circuit;
   finding unused programmable logic circuits of the integrated circuit with respect to the placed circuit design;
   marking flip-flop circuits corresponding to the unused programmable logic circuits as valid pipeline sites; and
   inserting one or more of the flip-flop circuits into the placed circuit design.

17. The method according to claim 16, further comprising increasing a power cost corresponding to addition of the one or more of the flip-flop circuits to the placed circuit design.

18. The method according to claim 17, wherein the one or more flip-flop circuits include one or more configurable bypassable flip-flop circuits.

19. The method according to claim 18, wherein the inserting the one or more flip-flop circuit performs inserting a pipeline or a pipeline stage into the placed circuit design.

20. The method according to claim 19, wherein the integrated circuit is a Programmable Logic Device.

* * * * *